US009273862B2

(12) United States Patent
Zeng

(10) Patent No.: US 9,273,862 B2
(45) Date of Patent: Mar. 1, 2016

(54) LED LIGHT DEDUSTING/COOLING SYSTEM

(71) Applicant: ASIA VITAL COMPONENTS CO., LTD., New Taipei (TW)

(72) Inventor: Xiao-Zhen Zeng, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 14/322,903

(22) Filed: Jul. 2, 2014

(65) Prior Publication Data

US 2016/0003462 A1 Jan. 7, 2016

(51) Int. Cl.

| | |
|---|---|
| ***H01L 23/467*** | (2006.01) |
| ***H01L 33/06*** | (2010.01) |
| ***H01J 61/52*** | (2006.01) |
| ***H01J 7/24*** | (2006.01) |
| ***F21V 29/63*** | (2015.01) |
| ***F21V 29/70*** | (2015.01) |
| ***F21K 99/00*** | (2010.01) |
| ***F21V 23/00*** | (2015.01) |
| *F21Y 101/02* | (2006.01) |

(52) U.S. Cl.

CPC ............... *F21V 29/63* (2015.01); *F21K 9/1355* (2013.01); *F21V 23/009* (2013.01); *F21V 29/70* (2015.01); *F21Y 2101/02* (2013.01)

(58) Field of Classification Search

CPC ..... F21Y 2101/02; F21V 29/02; F21V 29/74; H01L 2924/00; H01L 2224/48091

USPC ............. 257/13, 88, 98; 313/46; 362/382, 84, 362/231

See application file for complete search history.

(56) References Cited

U.S. PATENT DOCUMENTS

2007/0267976 A1* 11/2007 Bohler ................... B82Y 10/00 315/112
2010/0172122 A1* 7/2010 Ramer ...................... F21K 9/00 362/84
2010/0207501 A1* 8/2010 Radermacher ........ F21V 29/677 313/46
2010/0242519 A1* 9/2010 Breidenassel ......... F21V 29/004 62/264
2011/0074269 A1* 3/2011 Hisayasu et al. ................ 313/46
2011/0133655 A1* 6/2011 Recker ...................... H02J 9/02 315/159
2011/0134239 A1* 6/2011 Vadai ........................ F21S 2/00 348/143
2011/0175520 A1* 7/2011 Ramer .................... F21K 9/135 313/501
2011/0175528 A1* 7/2011 Rains, Jr. ................ F21K 9/135 315/51
2011/0199753 A1* 8/2011 Ramer ...................... F21K 9/00 362/84
2011/0215698 A1* 9/2011 Tong ....................... F21K 9/135 313/46
2012/0062095 A1* 3/2012 Horng ............................ 313/46
2012/0170263 A1* 7/2012 Rodriguez ............. F21V 29/02 362/230
2012/0212960 A1* 8/2012 Rodriguez ................ F21K 9/50 362/249.02
2012/0223640 A1* 9/2012 Koplow .................. F04D 17/16 315/50
2012/0250335 A1* 10/2012 Nakano ................... F21V 29/02 362/382
2012/0268936 A1* 10/2012 Pickard ................... F21K 9/135 362/249.02
2012/0293309 A1* 11/2012 Spiro ........................ F21S 2/00 340/12.32

* cited by examiner

*Primary Examiner* — Vongsavanh Sengdara
*Assistant Examiner* — Thai T Vuong
(74) *Attorney, Agent, or Firm* — C. G. Mersereau Nikolai & Mersereau, P.A.

(57) ABSTRACT

An LED light dedusting/cooling system includes a housing receiving therein a control member, a fan, a heat sink and an LED module. The fan and the LED module are respectively disposed on two opposite sides of the heat sink. The LED light dedusting/cooling system further includes a vibrator received in the housing and disposed on one side of the heat sink proximal to the fan and positioned between the heat sink and the fan. In operation, the vibrator can vibrate between the heat sink and the fan to shake (or shock) off the dust or alien articles attaching to the fan and the heat sink. Then, the fan operates to blow out the dust from the housing.

4 Claims, 5 Drawing Sheets

LED LIGHT DEDUSTING/COOLING SYSTEM

BACKGROUND OF THE INVENTION

1. Field of the Invention

The present invention relates generally to a lighting device, and more particularly to an LED light dedusting/cooling system.

2. Description of the Related Art

It is known that LED is a sort of solid semiconductor element capable of directly converting electrical energy into visible light. In comparison with the conventional light, the LED light has the advantages of high brightness, low energy consumption, long lifetime, energy saving and environmental protection. Therefore, the conventional halogen lights and fluorescent light tubes have been rapidly replaced with the LED lights.

In order to increase the luminous flux of the LED light, that is, increase the brightness of the LED light, various high-power LED lights have been developed and sold by many manufacturers. Due to the limitation of volume and the requirement of installation of sealing-type or semi-sealing-type housing, the LED light is generally inbuilt with an active heat dissipation device including a fan and radiating fins, especially with respect to such as projection lamp, down lamp, bulb lamp and cap lamp that employ LED lights. Such lighting device has some shortcomings that the use frequency is high and the use time is long. As a result, during a long-term operation, the inbuilt fan will take in a great amount of alien articles such as dust and hairs to accumulate in the interior space of the housing and on the surface of the heat dissipation device. This often leads to deterioration of the efficiency of the active heat dissipation device or even malfunction of the fan. In this case, the LED light will burn out due to overheating.

SUMMARY OF THE INVENTION

It is therefore a primary object of the present invention to provide an LED light dedusting/cooling system, which includes a housing and a vibrator received in the housing and positioned between a heat sink and a fan. In operation, the vibrator can vibrate to shake (or shock) off the dust (or powder) or alien articles attaching to the fan and the heat sink. Then, the fan operates to blow out the dust from the LED light.

It is a further object of the present invention to provide the above LED light dedusting/cooling system, in which a winding passage is annularly formed along the circumference of the LED light. The winding passage has a first end in communication with the external environment of the LED light and a second end nonlinearly extending to communicate with the interior of the LED light so as to prevent the alien articles from entering the LED light.

To achieve the above and other objects, the LED light dedusting/cooling system of the present invention includes a housing receiving therein a control member, a fan, a heat sink and an LED module. The fan and the LED module are respectively disposed on two opposite sides of the heat sink. The LED light dedusting/cooling system further includes a vibrator received in the housing and disposed on one side of the heat sink proximal to the fan and positioned between the heat sink and the fan.

In the above LED light dedusting/cooling system, the housing includes a light seat and a light shade mated with the light seat. A winding passage is annularly defined between a circumference of the light seat and a circumference of the light shade.

In the above LED light dedusting/cooling system, the light seat has an upward extending bottom section, which defines a receiving space. An upper end of the bottom section is formed with a nonlinear rim defining an opening in communication with the receiving space. Multiple connection sections are disposed on an inner side of the receiving space. The light shade has a front end and a rear end. The front end is formed with a window. Multiple connected sections are disposed at the rear end and mated with the connection sections of the receiving space of the light seat. The light shade has a radial flange formed on outer circumference of the light shade and a lower skirt section corresponding to the nonlinear rim. The radial flange has a root section integrally connected with the outer circumference of the light shade and a free end protruding to the nonlinear rim. The lower skirt section is positioned under the root section of the radial flange. The winding passage is defined between the nonlinear rim, the radial flange and the lower skirt section.

In the above LED light dedusting/cooling system, the nonlinear rim includes a radial flange and an axial skirt section. The radial flange radially protrudes from the upper end of the bottom section of the light seat. The axial skirt section axially protrudes from a radially protruding end of the radial flange.

In the above LED light dedusting/cooling system, the winding passage includes a first passage positioned between the free end of the radial flange and the axial skirt section. The first passage vertically extends from the first end to communicate with a second passage. The second passage horizontally extends to communicate with a third passage. The third passage vertically extends to the second end to communicate with the receiving space of the light seat.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
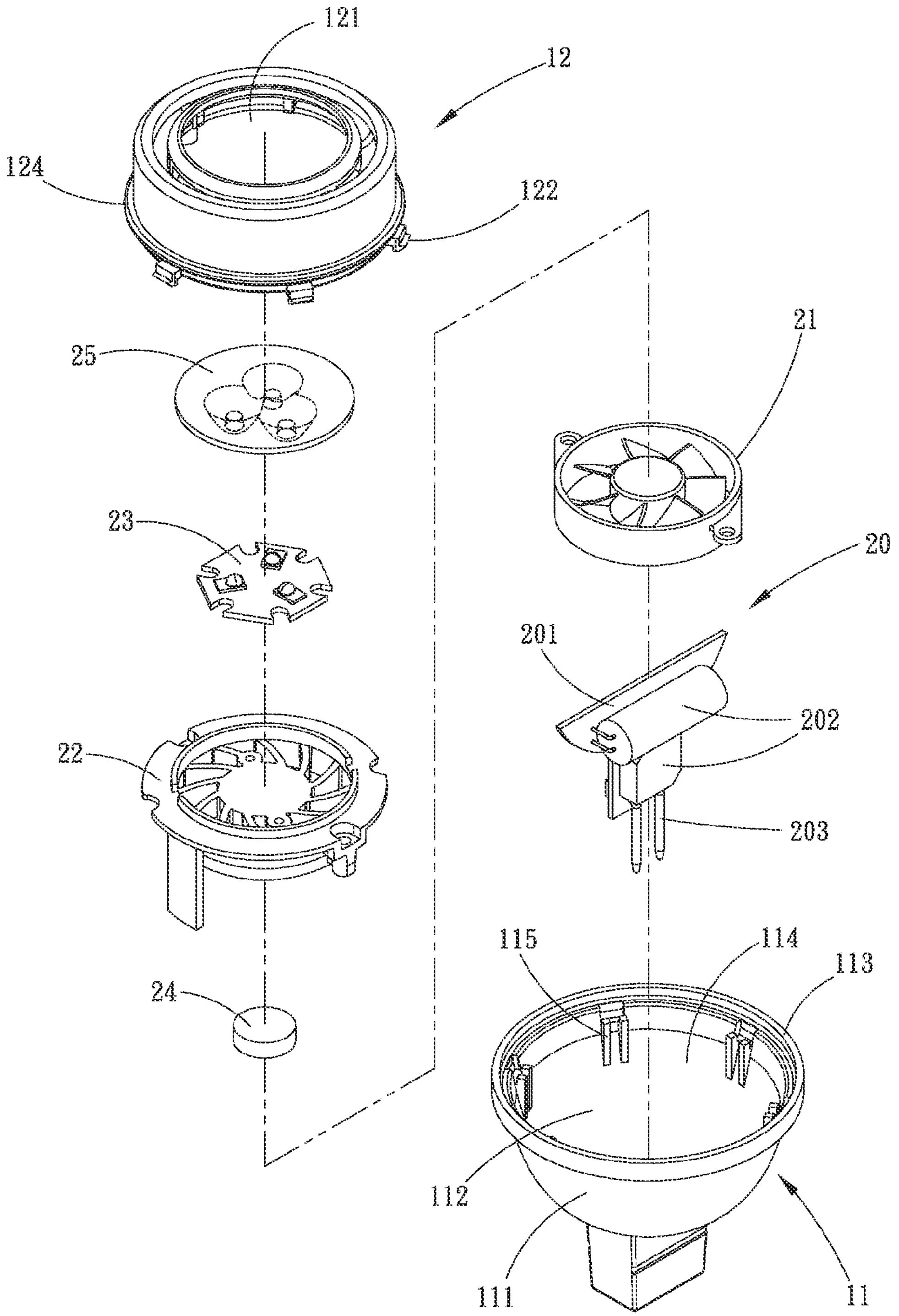
FIG. 1 is a perspective exploded view of the present invention.

The embodiments of the present invention will be described hereinafter with reference to the drawings, wherein the same components are denoted with the same reference numerals.

Figure 2:
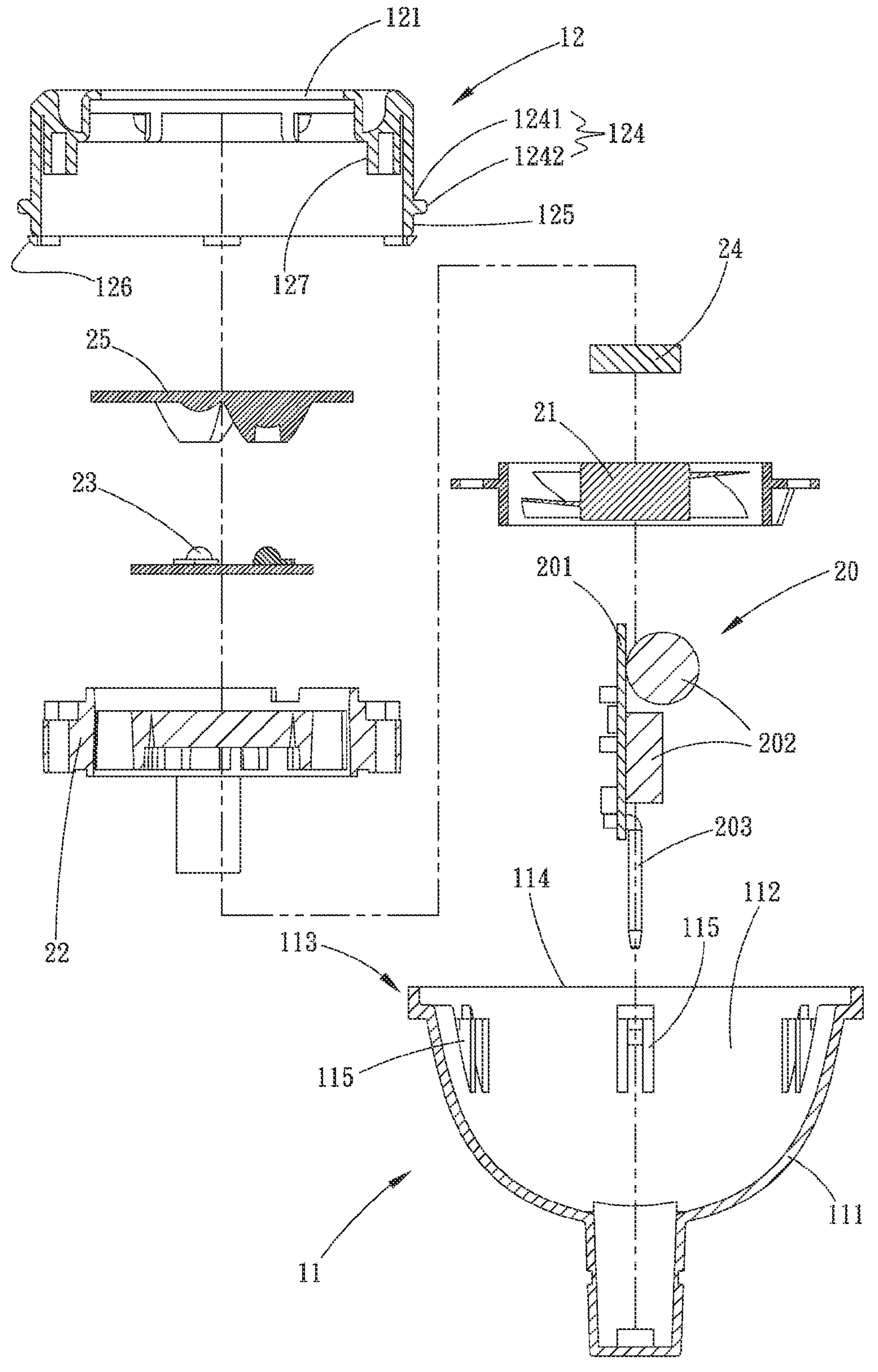
FIG. 2 is a sectional exploded view of the present invention.
Figure 3:
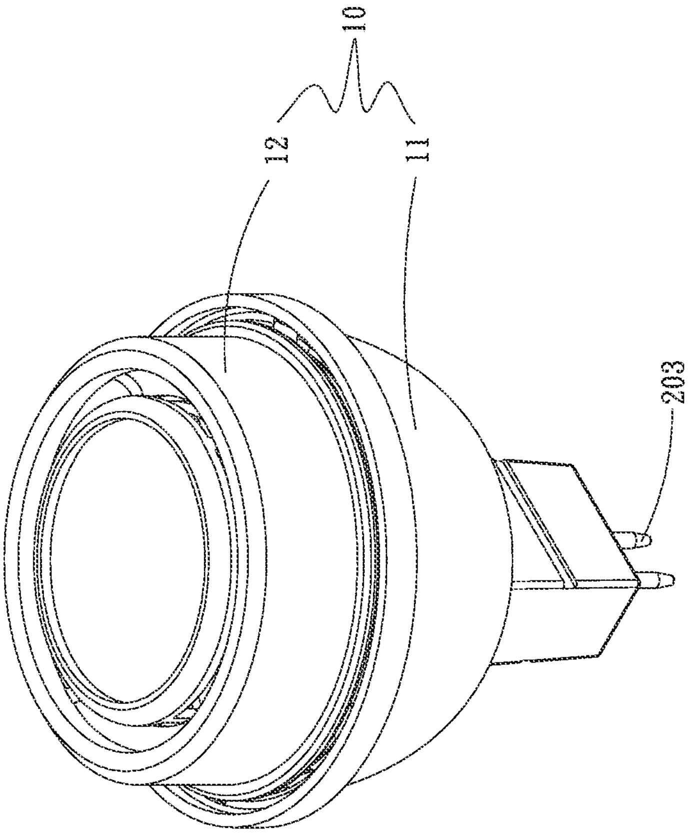
FIG. 3 is a perspective assembled view of the present invention.
Figure 4:
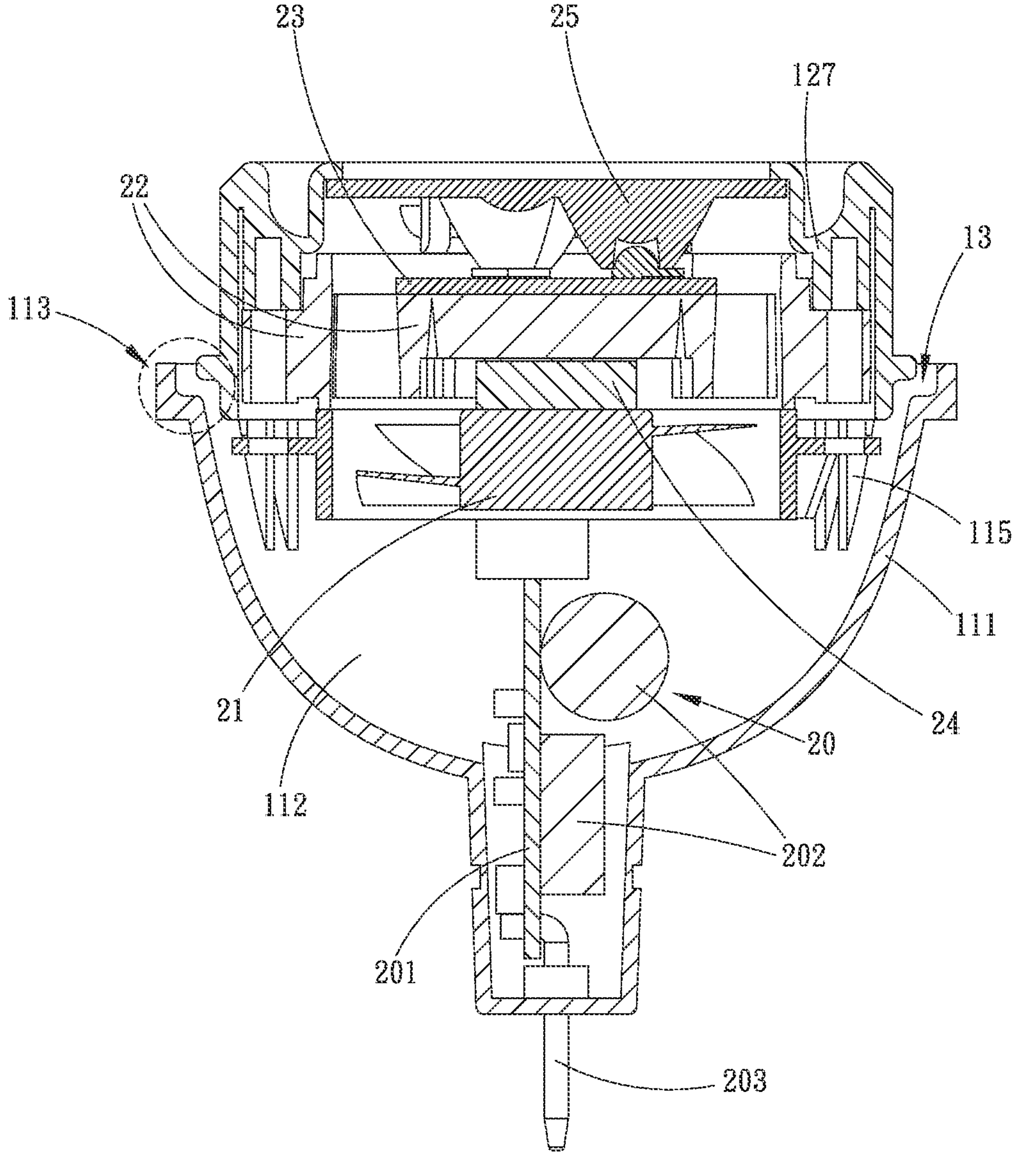
FIG. 4 is a sectional assembled view of the present invention.
Figure 5:
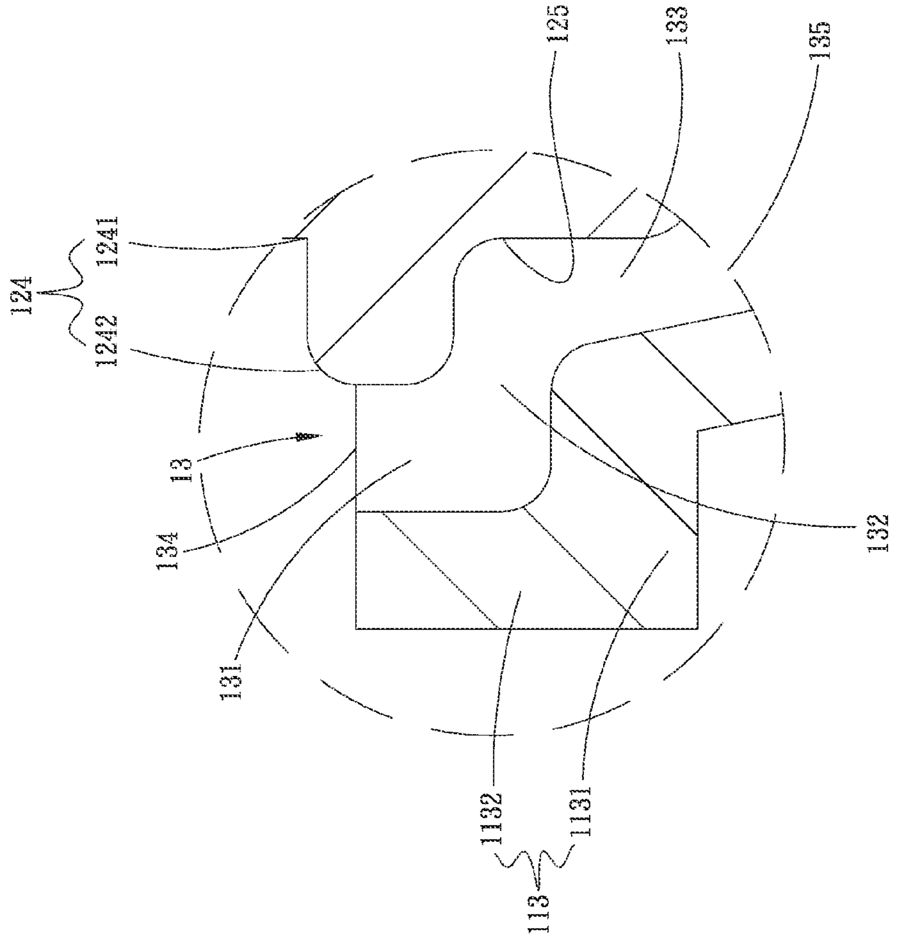
FIG. 5 is an enlarged view of circled area of FIG. 4.

Please refer to FIGS. 1 to 5. FIG. 1 is a perspective exploded view of the present invention. FIG. 2 is a sectional exploded view of the present invention. FIG. 3 is a perspective assembled view of the present invention. FIG. 4 is a sectional assembled view of the present invention. FIG. 5 is an enlarged view of circled area of FIG. 4. The LED light of the present invention includes a housing 10 receiving therein a control member 20, a fan 21, a heat sink 22, an LED module 23 and a vibrator 24. The fan 21 and the LED module 23 are respectively disposed on two opposite sides of the heat sink 22. The vibrator 24 is disposed on one side of the heat sink 22 proximal to the fan 21 and positioned between the heat sink 22 and the fan 21. In this embodiment, the vibrator 24 is a flat-type high-frequency-vibration micro-motor. The vibrator 24 is applicable to a small space to provide vibration operation. The control member 20 includes a circuit board 201, electronic components 202 and electrical contact pins 203. The control member 20 is powered by an external power supply of the LED light to supply necessary power for the LED module 23, the fan 21 and the vibrator 24.

The housing 10 includes a light seat 11 and a light shade 12 mated with the light seat 11. A winding passage 13 is annularly defined between a circumference of the light seat 11 and a circumference of the light shade 12. The light seat 11 has an upward extending bottom section 111, which defines a receiving space 112. An upper end of the bottom section 111 is formed with a nonlinear rim 113 defining an opening 114 in communication with the receiving space 112. Multiple connection sections 115 are disposed on an inner side of the receiving space 112.

The light shade 12 has a front end and a rear end. The front end is formed with a window 121 in which a lens 25 is disposed. Multiple connected sections 122 are disposed at the rear end and mated with the connection sections 115 of the light seat 11. The light shade 12 has a radial flange 124 formed on outer circumference of the light shade 12 and a lower skirt section 125 corresponding to the nonlinear rim 113. The radial flange 124 has a root section 1241 integrally connected with the outer circumference of the light shade 12 and a free end 1242 protruding to the nonlinear rim 113. The lower skirt section 125 is positioned under the root section 1241 of the radial flange 124. Multiple fixing sections 127 are disposed on the inner circumference of the light shade 12. Multiple fixing members such as screws (not shown) are tightened in the fixing sections 127 to connect the heat sink 22 and the fan 21 with the light shade 12 and align the LED module 23 on one side of the heat sink 22 with the lens 25 in the window 121.

After the light shade 12 is mated with the light seat 11, the winding passage 13 is defined between the nonlinear rim 113, the radial flange 124 and the lower skirt section 125. The nonlinear rim 113 includes a radial flange 1131 and an axial skirt section 1132. The radial flange 1131 radially protrudes from the upper end of the bottom section 111 of the light seat 11. The axial skirt section 1132 axially protrudes from a radially protruding end of the radial flange 1131. The radial flange 1131 and the axial skirt section 1132 substantially contain an angle of 90 degrees.

The winding passage 13 has several turns. The winding passage 13 has a first end 134 in communication with outer side of the housing 10 and a second end 135 in communication with an interior of the housing 10. The winding passage 13 substantially includes a first passage 131 positioned between the free end 1242 of the radial flange 124 and the axial skirt section 1132. The first passage 131 vertically extends from the first end 134 to communicate with a second passage 132. The second passage 132 horizontally extends to communicate with a third passage 133. The third passage 133 vertically extends to the second end 135 to communicate with the receiving space 112 of the light seat 11.

It should be noted that the vibrator 24 can vibrate at a subsonic or even an ultrasonic frequency by smaller amplitude. Therefore, in operation, the vibrator 24 can vibrate at high frequency to shake off the dust (or powder) or alien articles attaching to the fan 21 and the heat sink 22. Then, the fan 21 can operate to blow the dust through the interior of the housing 10 and the winding passage 13 to outer side. Moreover, the vibrator 24 can operate at high frequency by small amplitude with low noise. Therefore, the superimposed noise of the system is very low and the vibration itself will not affect the normal operation of the light. In addition, the control member 20 serves to control the operation and on/off time of the vibrator 24. For example, the vibrator 24 can be set to operate for 15~20 seconds every eight hours. The vibration time of the vibrator 24 is controllable so that the affection of the vibrator 24 to the light can be controlled within a minimum range.

Furthermore, the winding passage 13 is annularly defined between the circumference of the light seat 11 and the circumference of the light shade 12 to communicate the interior space of the housing 10 with the external environment of the housing 10 as an airflow passage. The vertical first passage 131 of the winding passage 13 is in communication with the horizontal second passage 132 and the second passage 132 is in communication with the vertical third passage 133. A first turn is defined between the first and second passages 131, 132 and a second turn is defined between the second and third passages 132, 133. Accordingly, the alien articles are prevented from entering the housing 10.

In conclusion, the vibrator 24 is received in the LED light of the present invention and positioned between the heat sink 22 and the fan 21. In operation, the vibrator 24 can vibrate to shake off the dust or alien articles attaching to the fan 21 and the heat sink 22. Then, the fan 21 can operate to blow out the dust from the LED light. The winding passage 13 is annularly defined around the LED light. One end of the winding passage 13 communicates with the outer environment of the LED light, while the other end of the winding passage 13 nonlinearly extends to communicate with the interior of the LED light so as to prevent the alien articles from entering the LED light.

The present invention has been described with the above embodiments thereof and it is understood that many changes and modifications in the above embodiments can be carried out without departing from the scope and the spirit of the invention that is intended to be limited only by the appended claims.

What is claimed is:

1. An LED light dedusting/cooling system comprising:

a housing receiving therein a control member, a fan, a heat sink and an LED module, the fan and the LED module being respectively disposed on two opposite sides of the heat sink; and a vibrator received in the housing and disposed on one side of the heat sink proximal to the fan and positioned between the heat sink and the fan;

wherein the housing includes a light seat and a light shade mated with the light seat, a winding passage being annularly defined between a circumference of the light seat and a circumference of the light shade;

wherein the winding passage includes a first passage positioned between a free end of a radial flange of a nonlinear rim and an axial skirt section of the nonlinear rim, the first passage vertically extending from a first end of the winding passage to communicate with a second passage, the second passage horizontally extending to communicate with a third passage, the third passage vertically extending to a second end of the winding passage to communicate with a receiving space of the light seat.

2. The LED light dedusting/cooling system as claimed in claim 1, wherein the light seat has an upward extending bottom section, which defines the receiving space, an upper end of the bottom section being formed with the nonlinear rim defining an opening in communication with the receiving space, multiple connection sections being disposed on an inner side of the receiving space, the light shade having a front end and a rear end, the front end being formed with a window, multiple connected sections being disposed at the rear end of the light shade and mated with the multiple connection sections of the receiving space of the light seat, the light shade having the radial flange formed on outer circumference of the light shade and a lower skirt section corresponding to the nonlinear rim, the radial flange having a root section integrally connected with the outer circumference of the light shade and the free end protruding to the nonlinear rim, the lower skirt section being positioned under the root section of the radial flange, the winding passage being defined between the nonlinear rim, the radial flange and the lower skirt section.

3. The LED light dedusting/cooling system as claimed in claim 2, wherein the nonlinear rim includes the radial flange and the axial skirt section, the radial flange radially protruding from the upper end of the bottom section of the light seat, the axial skirt section axially protruding from a radially protruding end of the radial flange.

4. The LED light dedusting/cooling system as claimed in claim 3, wherein the winding passage has the first end in communication with outer side of the housing and the second end in communication with an interior of the housing.

* * * * *